(12) United States Patent
An et al.

(10) Patent No.: US 11,630,159 B2
(45) Date of Patent: Apr. 18, 2023

(54) APPARATUS AND METHOD FOR CALCULATING CHARACTERISTICS OF BATTERY

(71) Applicant: SK On Co., Ltd., Seoul (KR)

(72) Inventors: Sung Wook An, Daejeon (KR); Ki Bum Sung, Daejeon (KR)

(73) Assignee: SK On Co., Ltd., Seoul (KR)

( * ) Notice: Subject to any disclaimer, the term of this patent is extended or adjusted under 35 U.S.C. 154(b) by 0 days.

(21) Appl. No.: 17/482,637

(22) Filed: Sep. 23, 2021

(65) Prior Publication Data

US 2022/0099746 A1 Mar. 31, 2022

(30) Foreign Application Priority Data

Sep. 24, 2020 (KR) ........................ 10-2020-0123505

(51) Int. Cl.
  *G01R 31/389* (2019.01)
  *H01M 10/48* (2006.01)
  *H01M 10/42* (2006.01)

(52) U.S. Cl.
  CPC ...... *G01R 31/389* (2019.01); *H01M 10/4285* (2013.01); *H01M 10/48* (2013.01); *H01M 2220/20* (2013.01)

(58) Field of Classification Search
  CPC ....... G01R 31/36; G01R 31/389; G06F 19/00; H01M 2220/20; H01M 10/48; H01M 10/4285; G08B 21/00
  USPC .......... 324/94, 425–435, 500, 750.3, 757.04, 324/762.03, 600, 663, 671, 200, 2, 7.13, 324/207.22, 239, 241, 515, 520, 530, 324/76.11, 105–124
  See application file for complete search history.

(56) References Cited

U.S. PATENT DOCUMENTS

| | | | |
|---|---|---|---|
| 10,067,176 B2 | 9/2018 | Sung et al. | |
| 2014/0333321 A1 | 11/2014 | Kawamura et al. | |
| 2019/0011504 A1 | 1/2019 | Kim et al. | |
| 2020/0144812 A1 | 5/2020 | Shin | |
| 2021/0284029 A1* | 9/2021 | Yamaguchi | ............... B60L 3/04 |

(Continued)

FOREIGN PATENT DOCUMENTS

| | | | |
|---|---|---|---|
| JP | 2013205082 A | 10/2013 | |
| KR | 1020130127828 A | 11/2013 | |
| KR | 101473396 B1 | 12/2014 | |

(Continued)

*Primary Examiner* — Lee E Rodak
*Assistant Examiner* — Trung Q Nguyen
(74) *Attorney, Agent, or Firm* — The Webb Law Firm

(57) ABSTRACT

The present invention relates to an apparatus and a method capable of calculating insulation resistances and parasitic capacitances of a battery outside the battery. In the present invention, when a positive electrode connector and a negative electrode connector are coupled to a positive electrode terminal and a negative electrode terminal of the battery, respectively, and a ground connector is coupled to a case of the battery, even though the battery is positioned inside a chamber in order to perform a temperature test or the like of the battery, the insulation resistances and the parasitic capacitances of the battery may be calculated without needing to move the battery to the outside of the chamber. Accordingly, the insulation resistances and the parasitic capacitances of the battery may be conveniently calculated.

7 Claims, 9 Drawing Sheets

(56) References Cited

U.S. PATENT DOCUMENTS

2022/0003823 A1\* 1/2022 Lee .................... G01R 31/3842

FOREIGN PATENT DOCUMENTS

| KR | 101771226 B1 | 9/2017 |
| KR | 1020180055202 A | 5/2018 |
| KR | 1020190072272 A | 6/2019 |

\* cited by examiner

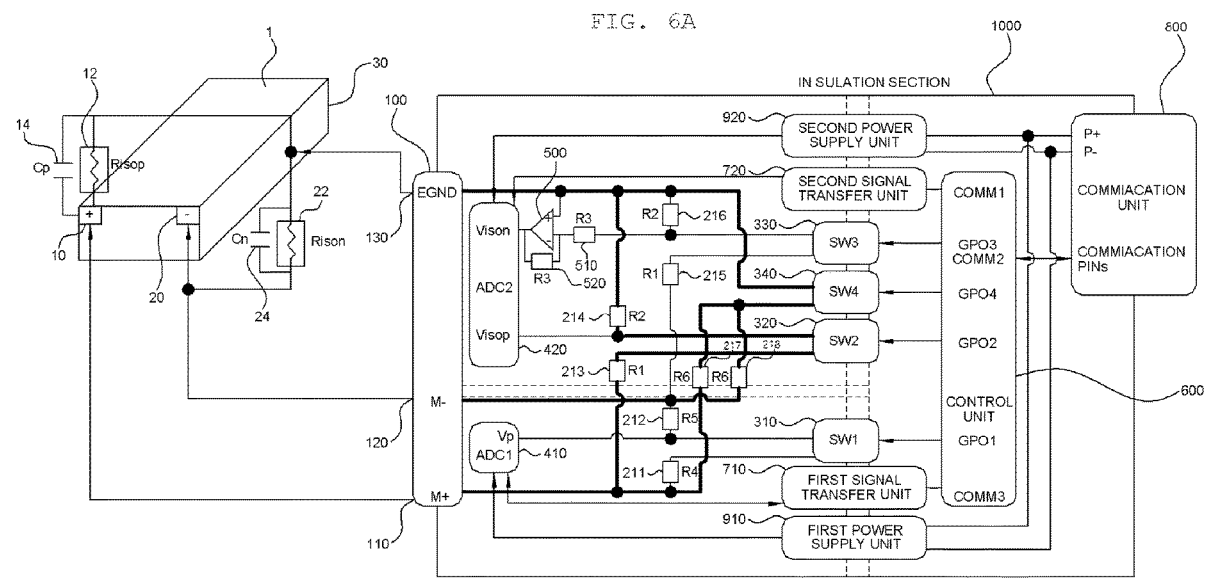

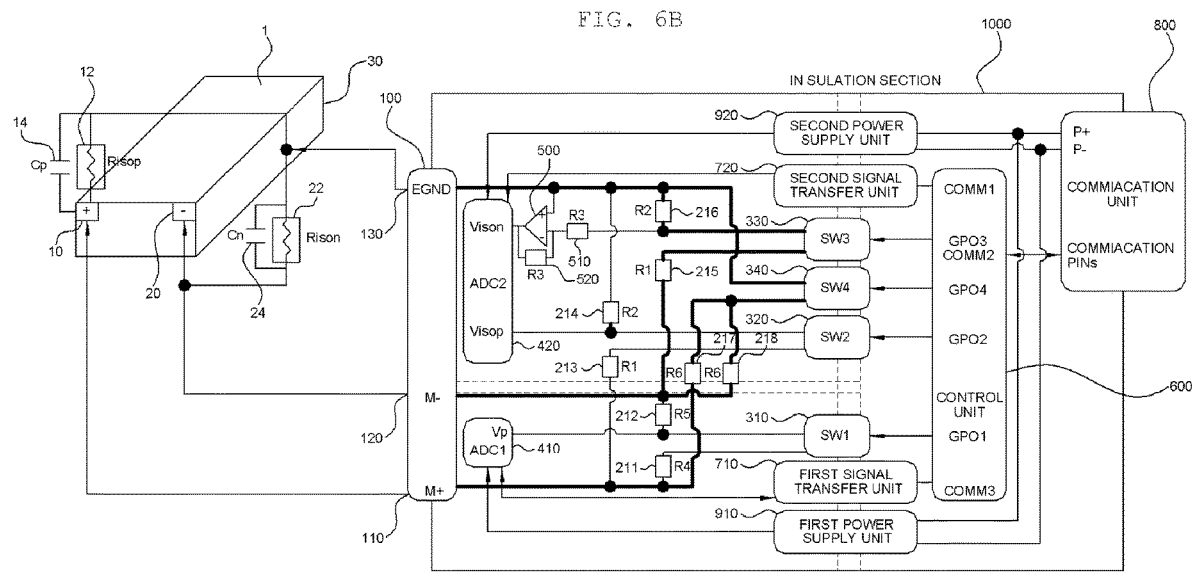

APPARATUS AND METHOD FOR CALCULATING CHARACTERISTICS OF BATTERY

CROSS-REFERENCE TO RELATED APPLICATION

This application claims priority to Korean Patent Application No. 10-2020-0123505 filed Sep. 24, 2020, the disclosure of which is hereby incorporated by reference in its entirety.

BACKGROUND OF THE INVENTION

Field of the Invention

The following disclosure relates to an apparatus and a method for calculating characteristics of a battery, and more particularly, to an apparatus and a method capable of calculating insulation resistances and parasitic capacitances of a battery outside the battery.

Description of Related Art

In an electric vehicle, a hybrid vehicle, or the like, that uses a battery as a power source, insulation resistances of a battery are very important because they inform a user that a ground fault has occurred. The insulation resistances of the battery include a positive electrode insulation resistance between a positive electrode terminal and a ground (e.g., a battery case) of the battery and a negative electrode insulation resistance between a negative electrode terminal and the ground of the battery. The positive electrode insulation resistance and the negative electrode insulation resistance have infinite values when the ground fault has not occurred, but have finite values when the ground fault has occurred.

FIG. 1A is a diagram illustrating a form of measuring a positive electrode insulation resistance of a battery by using a DCR meter, and FIG. 1B is a diagram illustrating a form of measuring a negative electrode insulation resistance of the battery by using the DCR meter. As illustrated in FIGS. 1A and 1B, conventionally, the DCR meter was used to measure the insulation resistances of the battery 1.

When insulation between a positive electrode terminal 10 of the battery 1 and the case of the battery 1 is broken, a positive electrode insulation resistor 12 exists, and when insulation between the negative electrode terminal 20 of the battery 1 and the case of the battery 1 is broken, a negative electrode insulation resistor 22 exists.

Conventionally, in order to measure an insulation resistance of the positive electrode insulation resistor 12 of the battery 1, the DCR meter was manually coupled to the positive electrode terminal 10 of the battery 1 and the case of the battery 1 as illustrated in FIG. 1A. At this time, the DCR meter applied a voltage between the positive electrode terminal 10 and the case, and measured the insulation resistance of the positive electrode insulation resistor 12 by dividing the applied voltage by a current flowing through the positive electrode terminal 10 and the case.

In addition, conventionally, in order to measure an insulation resistance of the negative electrode insulation resistor 22 of the battery 1, the DCR meter was manually coupled to the negative electrode terminal 20 of the battery 1 and the case of the battery 1 as illustrated in FIG. 1B. At this time, the DCR meter applied a voltage between the negative electrode terminal 20 and the case, and measured the insulation resistance of the negative electrode insulation resistor 22 by dividing the applied voltage by a current flowing through the negative electrode terminal 20 and the case.

As described above, in a conventional manner of measuring the insulation resistances, a separate voltage for measuring the insulation resistances should be manually applied to the battery 1, and thus, the user cannot but be exposed to a risk of an electric shock due to a high voltage applied to the battery 1 as it is.

In addition, in order to measure the insulation resistances of the battery 1 while performing a temperature test or the like of the battery 1 in a chamber (not illustrated), the user should move the battery 1 positioned in the chamber to the outside of the chamber, measure the insulation resistances of the battery 1, and put the battery 1 again into the chamber when the measurement of the insulation resistances ends. That is, the conventional manner of measuring the insulation resistances of the battery 1 has a problem that a measurement process is cumbersome.

Meanwhile, due to a structural problem of the battery 1, a positive electrode parasitic capacitor 14 coupled to the positive electrode insulation resistor 12 in parallel and a negative electrode parasitic capacitor 24 coupled to the negative electrode insulation resistor 22 in parallel inevitably exist. The larger the positive electrode parasitic capacitance $C_p$ of the positive electrode parasitic capacitor 14 and the negative electrode parasitic capacitance $C_n$ of the negative electrode parasitic capacitor 24, the longer the time required for calculating the insulation resistances of the battery 1. That is, only when the positive electrode parasitic capacitance $C_p$ of the positive electrode parasitic capacitor 14 and the negative electrode parasitic capacitance $C_n$ of the negative electrode parasitic capacitor 24 are accurately measured, the time required for calculating the insulation resistances of the battery 1 may also be accurately known.

FIG. 2A is a diagram illustrating a form of measuring a positive electrode parasitic capacitance of a battery by using an LCR meter, and FIG. 2B is a diagram illustrating a form of measuring a negative electrode parasitic capacitance of the battery by using the LCR meter. As illustrated in FIGS. 2A and 2B, conventionally, the LCR meter was used to measure the parasitic capacitances of the battery 1.

More specifically, conventionally, in order to measure the positive electrode parasitic capacitance of the battery 1, the LCR meter was manually coupled to the positive electrode terminal 10 of the battery 1 and the case of the battery 1 as illustrated in FIG. 2A. In addition, conventionally, in order to measure the negative electrode parasitic capacitance of the battery 1, the LCR meter was manually coupled to the negative electrode terminal 20 of the battery 1 and the case of the battery 1 as illustrated in FIG. 2B.

In the conventional manner of measuring the parasitic capacitances as described above, the LCR meter is affected by a voltage of the battery 1, and measurement accuracy is thus poor.

When the voltage of the battery 1 exceeds an allowable voltage specification of the LCR meter, there is a problem that the measurement itself is not properly performed.

In addition, as described above, in order to measure the parasitic capacitances of the battery 1 while performing a temperature test or the like of the battery 1 in the chamber, the user should move the battery 1 positioned in the chamber to the outside of the chamber, measure the parasitic capacitances of the battery 1, and put the battery 1 again into the chamber when the measurement of the parasitic capacitances ends. That is, the conventional manner of measuring the parasitic capacitances of the battery 1 has a problem that a measurement process is cumbersome.

Meanwhile, in Patent Document 1, A Y-capacitor installed between a direct current (DC) link stage and a chassis ground is added to an insulation resistance calculation model to derive an equation of state to which an extended Kalman filter may be applied, and an insulation resistance of a battery is then measured by using the equation of state.

RELATED ART DOCUMENT

Patent Document (Patent Document 1) Korean Patent Laid-Open Publication No. 2013-0127828

SUMMARY OF THE INVENTION

An embodiment of the present invention is directed to providing an apparatus and a method capable of simultaneously and accurately calculating a positive electrode insulation resistance and a negative electrode insulation resistance of a battery even when both positive electrode insulation and negative electrode insulation of the battery are broken.

Another embodiment of the present invention is directed to providing an apparatus and a method capable of conveniently measuring insulation resistances and parasitic capacitances of a battery even when the battery is positioned in a chamber in order to perform a temperature test or the like of the battery.

Still another embodiment of the present invention is directed to providing an apparatus and a method capable of automatically and conveniently measuring insulation resistances and parasitic capacitances beyond a conventional manner of manually measuring the insulation resistances and the parasitic capacitances.

Yet still another embodiment of the present invention is directed to providing an apparatus and a method capable of measuring insulation resistances of a battery in a safer manner beyond a conventional manner of applying a specific voltage to the battery in order to measure the insulation resistances of the battery.

In one general aspect, an apparatus for calculating characteristics of a battery includes: a positive electrode connector 110 coupled to a positive electrode terminal 10 of the battery 1; a negative electrode connector 120 coupled to a negative electrode terminal 20 of the battery 1; a ground connector 130 coupled to a case 30 of the battery 1; a first resistor 211 having one end coupled to the positive electrode connector 110; a second resistor 212 having one end coupled to the negative electrode connector 120; a first switch 310 having one end coupled to the other end of the first resistor 211 and the other end coupled to the other end of the second resistor 212; a first analog-digital converter (ADC) 410 coupled to the other end of the second resistor 212; a third resistor 213 having one end coupled to the positive electrode connector 110 and one end of the first resistor 211; a fourth resistor 214 having one end coupled to the ground connector 130; a second switch 320 having one end coupled to the other end of the third resistor 213 and the other end coupled to the other end of the fourth resistor 214; a fifth resistor 215 having one end coupled to the negative electrode connector 120 and one end of the second resistor 212; a sixth resistor 216 having one end coupled to the ground connector 130 and one end of the fourth resistor 214; a third switch 330 having one end coupled to the other end of the fifth resistor 215 and the other end coupled to the other end of the sixth resistor 216; a second ADC 420 coupled to the other end of the fourth resistor 214 and the other end of the sixth resistor 216; and a control unit 600 controlling turn-on/off of the first switch 310, the second switch 320, and the third switch 330 and calculating insulation resistances of the battery 1 through values each output from the first ADC 410 and the second ADC 420.

The apparatus for calculating characteristics of a battery may further include: a first amplifier resistor 510 having one end coupled to the other end of the sixth resistor 216; a second amplifier resistor 520 having one end coupled to the other end of the first amplifier resistor 510; and an operational amplifier 500 including an inverting input terminal coupled to the other end of the first amplifier resistor 510 and one end of the second amplifier resistor 520, a non-inverting input terminal coupled to the ground connector 130, one end of the fourth resistor 214, and one end of the sixth resistor 216, and an output terminal coupled to the other end of the second amplifier resistor 520 and the second ADC 420.

The control unit 600 may control only the first switch 310 to be turned on to obtain a value output from the first ADC 410 in a state in which only the first switch 310 is turned on, and may calculate a voltage of the battery 1 through the value output from the first ADC 410 in the state in which only the first switch 310 is turned on and calculate the insulation resistances of the battery 1 by using the voltage of the battery 1.

In addition, the control unit 600 may control only the second switch 320 to be turned on to obtain a value output from the second ADC 420 in a state in which only the second switch 320 is turned on, may control only the third switch 330 to be turned on to obtain a value output from the second ADC 420 in a state in which only the third switch 330 is turned on, and may calculate the insulation resistances of the battery 1 by further using the value output from the second ADC 420 in the state in which only the second switch 320 is turned on and the value output from the second ADC 420 in the state in which only the third switch 330 is turned on.

The apparatus for calculating characteristics of a battery may further include: a seventh resistor 217 having one end coupled to the positive electrode connector 110, one end of the first resistor 211, and one end of the third resistor 213; an eighth resistor 218 having one end coupled to the negative electrode connector 120, one end of the second resistor 212, and one end of the fifth resistor 215; and a fourth switch 340 having one end coupled to the other end of the seventh resistor 217 and the other end of the eighth resistor 218 and the other end coupled to the ground connector 130, one end of the fourth resistor 214, and one end of the sixth resistor 216, wherein the control unit 600 additionally controls turn-on/off of the fourth switch 340, and calculates parasitic capacitances of the battery through the voltage of the battery 1, the insulation resistances of the battery 1, and the value output from the second ADC 420.

Here, the control unit 600 may control only the fourth switch 340 to be turned on and then control the second switch 320 to be turned on to obtain a value output from the second ADC 420 in a state in which only the second switch 320 and the fourth switch 340 are turned on, and may calculate a positive electrode parasitic capacitance of the battery 1 by using the value output from the second ADC 420 in the state in which only the second switch 320 and the fourth switch 340 are turned on.

Alternatively, the control unit 600 may control only the fourth switch 340 to be turned on and then control the third switch 330 to be turned on to obtain a value output from the second ADC 420 in a state in which only the third switch 330 and the fourth switch 340 are turned on, and may calculate a negative electrode parasitic capacitance of the battery 1 by using the value output from the second ADC 420 in the state in which only the third switch 330 and the fourth switch 340 are turned on.

In another general aspect, a method for calculating characteristics of a battery by using the apparatus for calculating characteristics of a battery described above includes: controlling only the first switch 310 to be turned on; obtaining a value output from the first ADC 410 in a state in which only the first switch 310 is turned on; calculating a voltage of the battery 1 through the value output from the first ADC 410 in the state in which only the first switch 310 is turned on; controlling only the second switch 320 to be turned on; obtaining a value output from the second ADC 420 in a state in which only the second switch 320 is turned on; controlling only the third switch 330 to be turned on; obtaining a value output from the second ADC 420 in a state in which only the third switch 330 is turned on; and calculating insulation resistances of the battery 1 by using the voltage of the battery 1, the value output from the second ADC 420 in the state in which only the second switch 320 is turned on, and the value output from the second ADC 420 in the state in which only the third switch 330 is turned on.

Here, the apparatus for calculating characteristics of a battery may further include: a seventh resistor 217 having one end coupled to the positive electrode connector 110, one end of the first resistor 211, and one end of the third resistor 213; an eighth resistor 218 having one end coupled to the negative electrode connector 120, one end of the second resistor 212, and one end of the fifth resistor 215; and a fourth switch 340 having one end coupled to the other end of the seventh resistor 217 and the other end of the eighth resistor 218 and the other end coupled to the ground connector 130, one end of the fourth resistor 214, and one end of the sixth resistor 216, and the method for calculating characteristics of a battery may further include, after the calculating of the insulation resistances of the battery 1: controlling only the fourth switch 340 to be turned on; controlling the second switch 320 to be turned on in a state in which the fourth switch 340 is turned on; obtaining a value output from the second ADC 420 in a state in which only the second switch 320 and the fourth switch 340 are turned on; and calculating a positive electrode parasitic capacitance of the battery 1 by using the voltage of the battery 1, the insulation resistances of the battery 1, and the value output from the second ADC 420 in the state in which only the second switch 320 and the fourth switch 340 are turned on.

Alternatively, the apparatus for calculating characteristics of a battery may further include: a seventh resistor 217 having one end coupled to the positive electrode connector 110, one end of the first resistor 211, and one end of the third resistor 213; an eighth resistor 218 having one end coupled to the negative electrode connector 120, one end of the second resistor 212, and one end of the fifth resistor 215; and a fourth switch 340 having one end coupled to the other end of the seventh resistor 217 and the other end of the eighth resistor 218 and the other end coupled to the ground connector 130, one end of the fourth resistor 214, and one end of the sixth resistor 216, and the method for calculating characteristics of a battery may further include, after the calculating of the insulation resistances of the battery 1: controlling only the fourth switch 340 to be turned on; controlling the third switch 330 to be turned on in a state in which the fourth switch 340 is turned on; obtaining a value output from the second ADC 420 in a state in which only the third switch 330 and the fourth switch 340 are turned on; and calculating a negative electrode parasitic capacitance of the battery 1 by using the voltage of the battery 1, the insulation resistances of the battery 1, and the value output from the second ADC 420 in the state in which only the third switch 330 and the fourth switch 340 are turned on.

BRIEF DESCRIPTION OF THE DRAWINGS

FIG. 6A is a diagram illustrating a current path when only the second switch and a fourth switch are controlled to be turned on in the apparatus for calculating characteristics of a battery of FIG. 3.

FIG. 6B is a diagram illustrating a current path when only the third switch and the fourth switch are controlled to be turned on in the apparatus for calculating characteristics of a battery of FIG. 3.

| [Detailed Description of Main Elements] | |
|---|---|
| 1: battery | 10: positive electrode terminal |
| 20: negative electrode terminal | 30: case |
| 100: connector | 110: positive electrode connector |
| 120: negative electrode connector | 130: ground connector |
| 211: first resistor | 212: second resistor |
| 213: third resistor | 214: fourth resistor |
| 215: fifth resistor | 216: sixth resistor |
| 217: seventh resistor | 218: eighth resistor |
| 310: first switch | 320: second switch |
| 330: third switch | 340: fourth switch |
| 410: first ADC | 420: second ADC |
| 500: operational amplifier | 510: first amplifier resistor |
| 520: second amplifier resistor | 600: control unit |
| 1000: apparatus for calculating characteristics of battery | |

DESCRIPTION OF THE INVENTION

Hereinafter, an apparatus and a method for calculating characteristics of a battery according to the present invention will be described in detail with reference to the accompanying drawings. The accompanying drawings are provided only by way of example in order to sufficiently transfer the technical spirit of the present invention to those skilled in the art, and the present invention is not limited to the accompanying drawing provided below, but may be implemented in other forms. In the present specification, the term 'or' refers to a combination of a plurality of related items or any one of a plurality of related items.

Figure 1A:
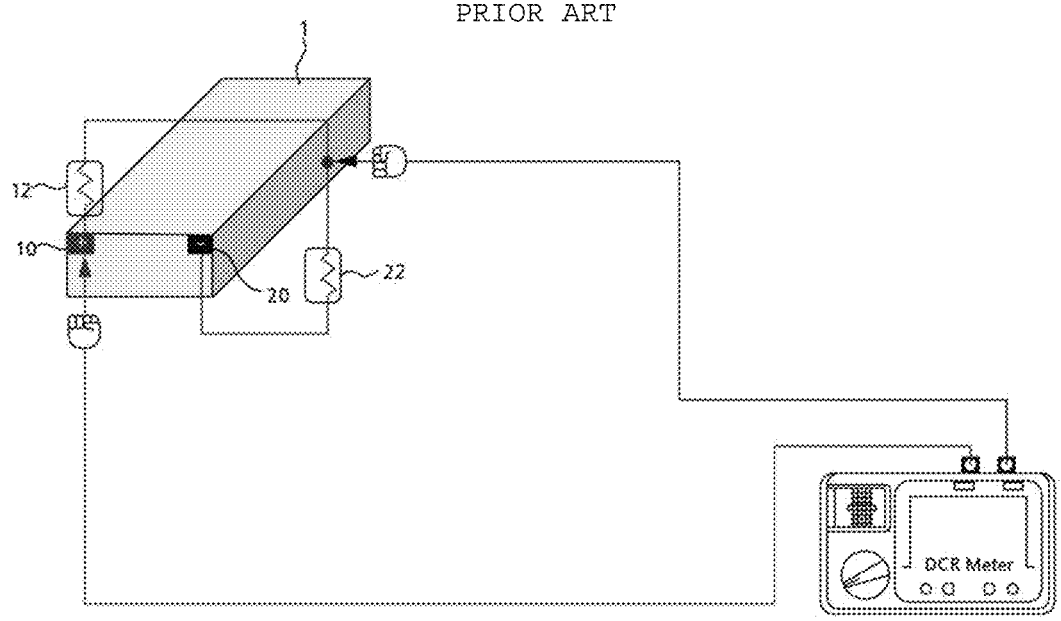
FIG. 1A is a diagram illustrating a form of measuring a positive electrode insulation resistance of a battery by using a DCR meter.
Figure 1B:
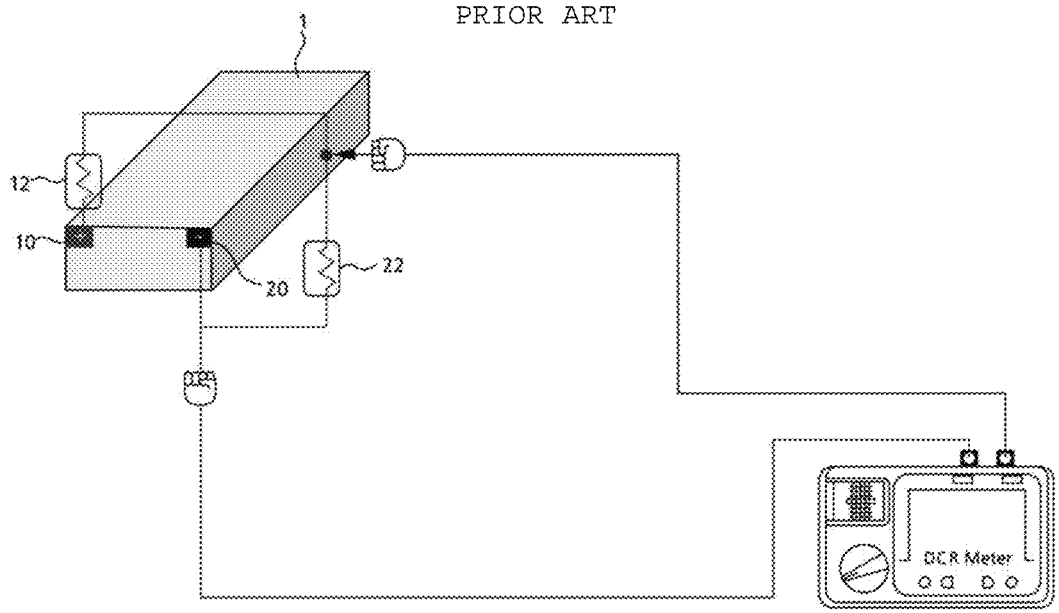
FIG. 1B is a diagram illustrating a form of measuring a negative electrode insulation resistance of the battery by using the DCR meter.
Figure 2A:
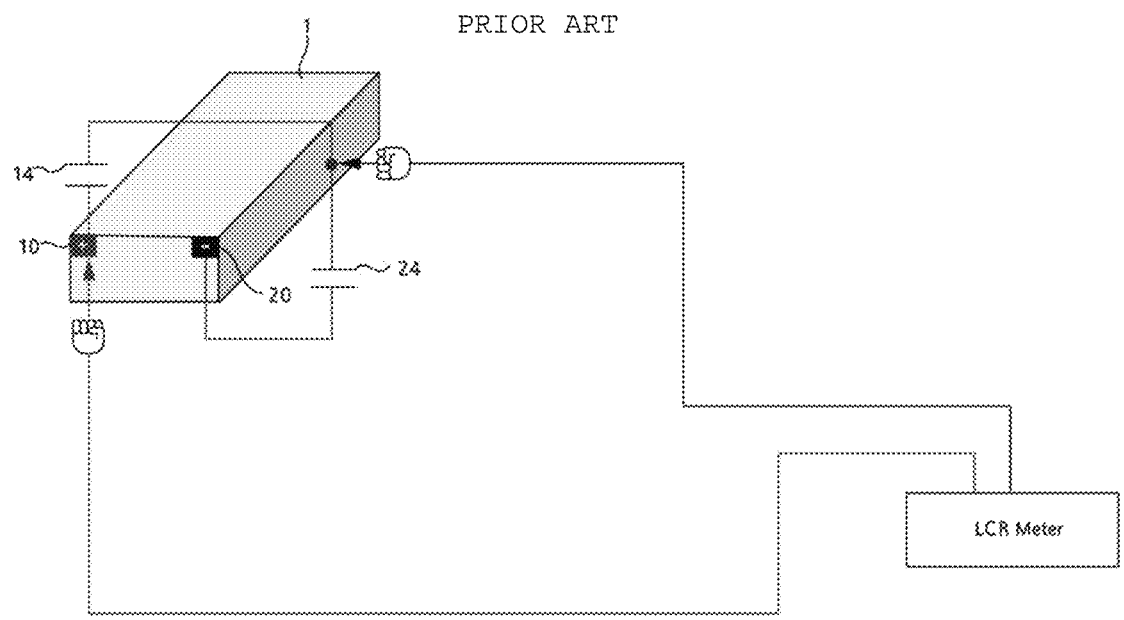
FIG. 2A is a diagram illustrating a form of measuring a positive electrode parasitic capacitance of a battery by using an LCR meter.
Figure 2B:
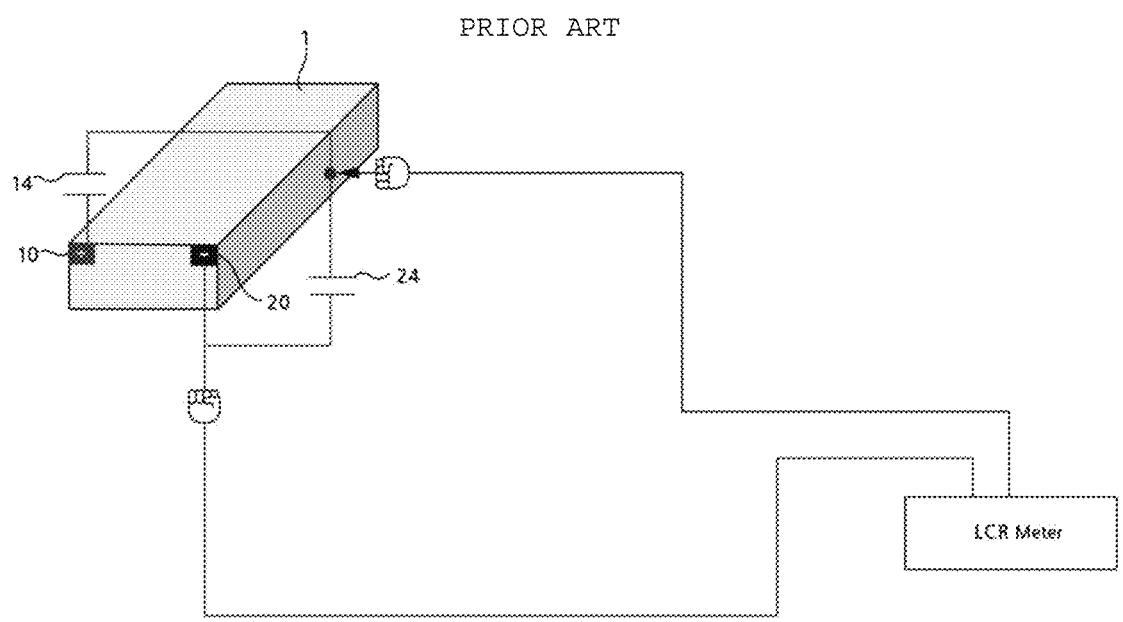
FIG. 2B is a diagram illustrating a form of measuring a negative electrode parasitic capacitance of the battery by using the LCR meter.
Figure 3:
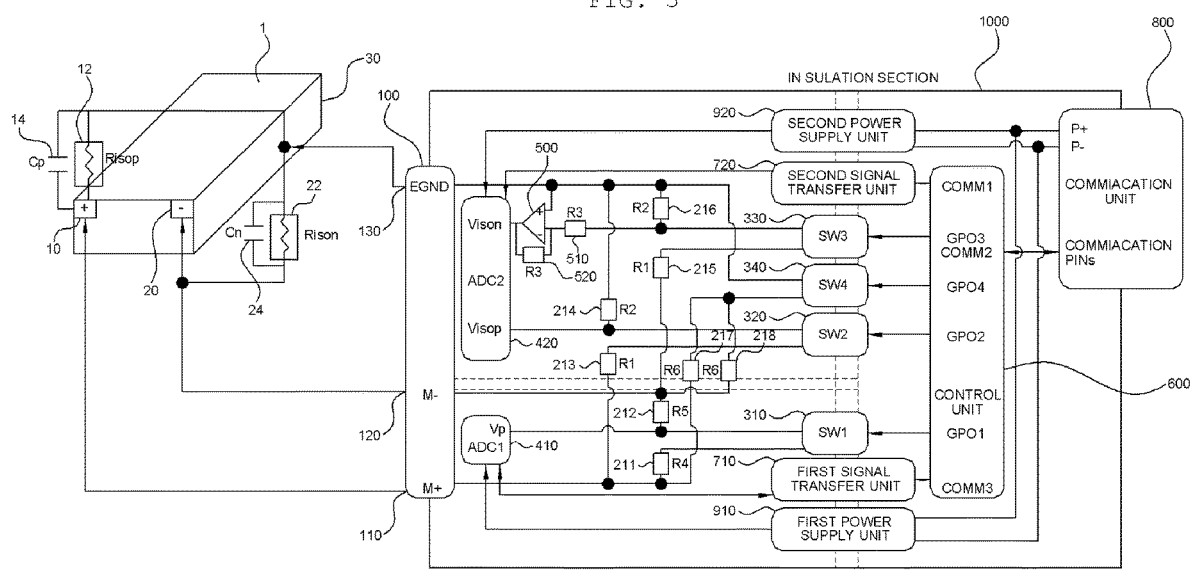
FIG. 3 is a diagram illustrating an apparatus for calculating characteristics of a battery according to the present invention.

FIG. 3 is a diagram illustrating an apparatus for calculating characteristics of a battery according to the present invention. As illustrated in FIG. 3, an apparatus 1000 for calculating characteristics of a battery according to the present invention may include a connector 100 electrically coupled to a battery 1.

In the present invention, the battery 1, which is a target of characteristic calculation, may be installed in an electric vehicle, a hybrid vehicle, or the like. In addition, the battery 1 may be a battery module including a plurality of battery cells or a battery pack including a plurality of battery modules.

The battery 1 includes a positive electrode terminal 10 and a negative electrode terminal 20, and includes a case 30 surrounding the plurality of battery cells or the plurality of battery modules. Here, the case 30 corresponds to a floating ground of the apparatus 1000 for calculating characteristics of a battery.

The characteristics of the battery 1 to be calculated in the present invention are a positive electrode insulation resistance Risop and a negative electrode insulation resistance Rison of the battery, and are additionally a positive electrode parasitic capacitance Cp or a negative electrode parasitic capacitance Cn of the battery.

As described above, when insulation between the positive electrode terminal 10 of the battery 1 and the case 30 of the battery 1 is broken, a positive electrode insulation resistor 12 exists, and when insulation between the negative electrode terminal 20 of the battery 1 and the case 30 of the battery 1 is broken, a negative electrode insulation resistor 22 exists. In addition, due to a structural problem of the battery 1, a positive electrode parasitic capacitor 14 coupled to the positive electrode insulation resistor 12 in parallel and a negative electrode parasitic capacitor 24 coupled to the negative electrode insulation resistor 22 in parallel inevitably exist.

The connector 100 includes a positive electrode connector 110, a negative electrode connector 120, and a ground connector 130. Here, the positive electrode connector 110 is coupled to the positive electrode terminal 10 of the battery 1, the negative electrode connector 120 is coupled to the negative electrode terminal 20 of the battery 1, and the ground connector 130 is coupled to the case 30 of the battery 1. In the present invention, when the positive electrode connector 110 and the negative electrode connector 120 are coupled to the positive electrode terminal 10 and the negative electrode terminal 20 of the battery 1, respectively, and the ground connector 130 is coupled to the case 30 of the battery 1, even though the battery 1 is positioned inside a chamber (not illustrated) in order to perform a temperature test or the like of the battery 1, characteristics of the battery 1 may be calculated without needing to move the battery 1 to the outside of the chamber, and thus, the characteristics of the battery 1 may be conveniently calculated.

The apparatus 1000 for calculating characteristics of a battery according to the present invention includes a first resistor 211, a second resistor 212, a first switch 310, and a first analog-digital converter (ADC) 410.

The first resistor 211 has one end coupled to the positive electrode connector 110, and the second resistor 212 has one end coupled to the negative electrode connector 120. The first switch 310 has one end coupled to the other end of the first resistor 211 and the other end coupled to the other end of the second resistor 212. Here, the first switch 310 may be formed of only a solid state relay (SSR) or be formed of a combination of a digital isolator and a solid state relay. The first ADC 410 is coupled to the other end of the second resistor 212. The first resistor 211, the second resistor 212, the first switch 310, and the first ADC 410 are used to calculate a voltage Vb of the battery 1 as described later.

The apparatus 1000 for calculating characteristics of a battery according to the present invention includes a third resistor 213, a fourth resistor 214, a fifth resistor 215, a sixth resistor 216, a second switch 320, a third switch 330, and a second ADC 420.

The third resistor 213 has one end coupled to the positive electrode connector 110 and one end of the first resistor 211, and the fourth resistor 214 has one end coupled to the ground connector 130. The fifth resistor 215 has one end coupled to the negative electrode connector 120 and one end of the second resistor 212, and the sixth resistor 216 has one end coupled to the ground connector 130 and one end of the fourth resistor 214.

The second switch 320 has one end coupled to the other end of the third resistor 213 and the other end coupled to the other end of the fourth resistor 214. The third switch 330 has one end coupled to the other end of the fifth resistor 215 and the other end coupled to the other end of the sixth resistor 216. Here, each of the second switch 320 and the third switch 330 may be formed of a solid state relay. The second ADC 420 is coupled to the other end of the fourth resistor 214 and the other end of the sixth resistor 216.

The third resistor 213, the fourth resistor 214, the second switch 320, and the second ADC 420 are used to calculate a positive electrode insulation voltage Visop and the positive electrode parasitic capacitance Cp. In addition, the fifth resistor 215, the sixth resistor 216, the third switch 330, and the second ADC 420 are used to calculate a negative electrode insulation voltage Vison and the negative electrode parasitic capacitance Cn.

The apparatus 1000 for calculating characteristics of a battery according to the present invention may include a first amplifier resistor 510, a second amplifier resistor 520, and an operational amplifier 500.

The first amplifier resistor 510 has one end coupled to the other end of the sixth resistor 216, and the second amplifier resistor 520 has one end coupled to the other end of the first amplifier resistor 510.

The operational amplifier 500 includes an inverting input terminal, a non-inverting input terminal, and an output terminal. The inverting input terminal is coupled to the other end of the first amplifier resistor 510 and one end of the second amplifier resistor 520. The non-inverting input terminal is coupled to the ground connector 130, one end of the fourth resistor 214, and one end of the sixth resistor 216. The output terminal is coupled to the other end of the second amplifier resistor 520 and the second ADC 420. The operational amplifier 500 serves to invert and amplify a voltage applied across the sixth resistor 216, and then transfer the inverted and amplified voltage to the second ADC 420.

The apparatus 1000 for calculating characteristics of a battery according to the present invention may include a seventh resistor 217, an eighth resistor 218, and a fourth switch 340.

The seventh resistor 217 has one end coupled to the positive electrode connector 110, one end of the first resistor 211, and one end of the third resistor 213. The eighth resistor 218 has one end coupled to the negative electrode connector 120, one end of the second resistor 212, and one end of the fifth resistor 215.

The fourth switch 340 has one end coupled to the other end of the seventh resistor 217 and the other end of the eighth resistor 218. In addition, the fourth switch 340 has the other end coupled to the ground connector 130, one end of the fourth resistor 214, and one end of the sixth resistor 216. Here, the fourth switch 340 may be formed of only a solid state relay or be formed of a combination of a digital isolator and a solid state relay.

The seventh resistor 217, the eighth resistor 218, and the fourth switch 340 are used to calculate the positive electrode parasitic capacitance Cp and the negative electrode parasitic capacitance Cn of the battery 1, together with the second ADC 420.

In addition, the apparatus 1000 for calculating characteristics of a battery according to the present invention includes a control unit 600, a first signal transfer unit 710, a second signal transfer unit 720, a communication unit 800, a first power supply unit 910, and a second power supply unit 920.

The control unit 600 may control turn-on/off of the first switch 310, the second switch 320, and the third switch 330. In addition, the control unit 600 may obtain values each output from the first ADC 410 and the second ADC 420 when it controls the turn-on/off of the first switch 310, the second switch 320, and the third switch 330. In addition, the control unit 600 may simultaneously calculate the positive electrode insulation resistance Risop and the negative electrode insulation resistance Rison of the battery 1 through the values each output from the first ADC 410 and the second ADC 420. In the present invention, the control unit 600 may be formed of a microcontroller unit (MCU) in order to perform the control of the switch as described above, obtainment of digital values from the ADCs, and perform arithmetic processing through the obtained digital values.

The first signal transfer unit 710 may transfer the value output from the first ADC 410 to the control unit 600, and the second signal transfer unit 720 may transfer the value output from the second ADC 420 to the control unit 600. Each of the first signal transfer unit 710 and the second signal transfer unit 720 may be formed of a digital isolator. Alternatively, each of the first signal transfer unit 710 and the second signal transfer unit 720 may be formed of an opto-coupler.

The control unit 600 may additionally control turn-on/off of the fourth switch 340. In this case, the control unit 600 may obtain a value output from the second ADC 420 according to the additional turn-on/off control of the fourth switch 340. In addition, the control unit 600 may calculate the positive electrode parasitic capacitance Cp and the negative electrode parasitic capacitance Cn of the battery 1 through the voltage of the battery 1, the insulation resistances of the battery 1, and the value output from the second ADC 420.

The communication unit 800 may be communicatively coupled to an apparatus (i.e., an external apparatus) positioned outside the apparatus 1000 for calculating characteristics of a battery. When the communication unit 800 is communicatively coupled to the external apparatus, the communication unit 800 serves to transfer a characteristic calculation command of the battery 1 received from the external apparatus to the control unit 600. To this end, the communication unit 800 is communicatively coupled to the control unit 600 in the apparatus 1000 for calculating characteristics of a battery. Here, the characteristic calculation command of the battery 1 may include one or more of a voltage calculation command of the battery 1, an insulation resistance calculation command of the battery 1, and a parasitic capacitance calculation command of the battery 1.

The communication unit 800 is also communicatively coupled to the first power supply unit 910 and the second power supply unit 920. When the communication unit 800 gives power supply commands to the first power supply unit 910 and the second power supply unit 920, the first power supply unit 910 supplies driving power to the first ADC 410, and the second power supply unit 920 supplies driving power to the second ADC 420.

Figure 4:
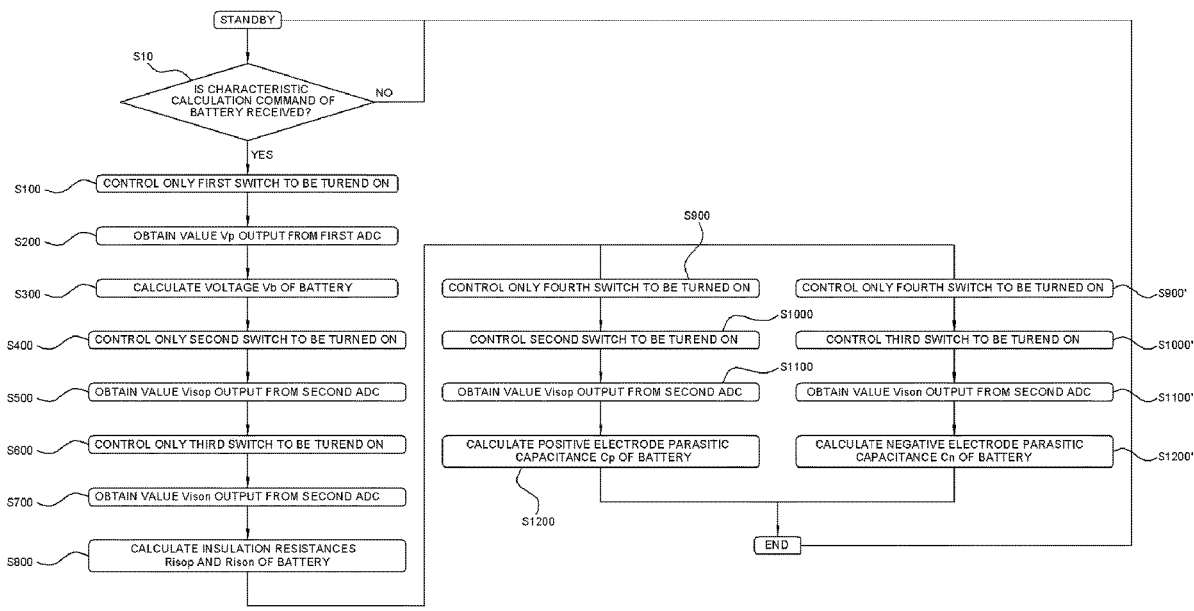
FIG. 4 is a flowchart illustrating a method for calculating characteristics of a battery using the apparatus for calculating characteristics of a battery according to FIG. 3.

FIG. 4 is a flowchart illustrating a method for calculating characteristics of a battery using the apparatus for calculating characteristics of a battery according to FIG. 3. Hereinafter, a specific embodiment of calculating characteristics of a battery will be described with further reference to FIG. 4.

First, the apparatus 1000 for calculating characteristics of a battery is in a standby state, and it is periodically determined whether or not the communication unit 800 receives the characteristic calculation command of the battery 1 from the external apparatus (S10).

When the communication unit 800 does not receive the characteristic calculation command of the battery 1 from the external apparatus, the apparatus 1000 for calculating the characteristics of the battery is still in the standby state.

When the communication unit 800 receives the characteristic calculation command of the battery 1 from the external apparatus, the communication unit 800 transfers the characteristic calculation command of the battery 1 received from the external apparatus to the control unit 600. At this time, the communication unit 800 may give power supply commands to the first power supply unit 910 and the second power supply unit 920. Accordingly, the first power supply unit 910 supplies driving power to the first ADC 410, and the second power supply unit 920 supplies driving power to the second ADC 420.

When the control unit 600 receives the characteristic calculation command of the battery 1 from the communication unit 800, the control unit 600 controls only the first switch 310 to be turned on for a preset time (e.g., A seconds) (S100).

After the step S100, the control unit 600 obtains a value Vp output from the first ADC 410 in a state in which only the first switch 310 is turned on (S200).

Figure 5A:
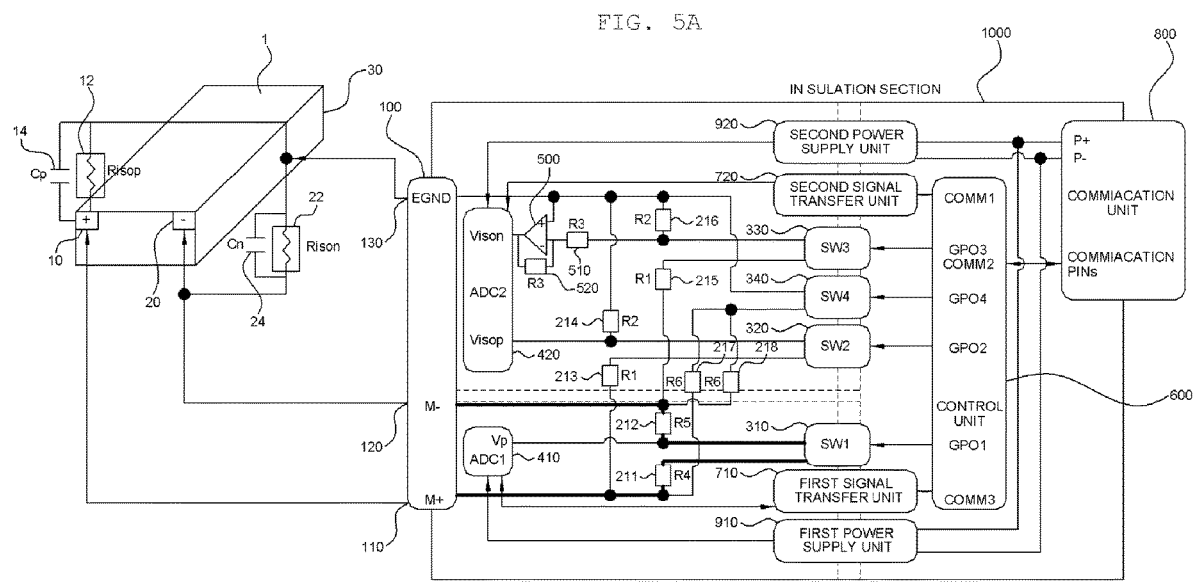
FIG. 5A is a diagram illustrating a current path when only a first switch is controlled to be turned on in the apparatus for calculating characteristics of a battery of FIG. 3.

FIG. 5A is a diagram illustrating a current path when only the first switch is controlled to be turned on in the apparatus for calculating characteristics of a battery of FIG. 3. As illustrated in FIG. 5A, when the control unit 600 controls only the first switch 310 to be turned on, a current path from the positive electrode terminal 10 of the battery 1 to the negative electrode terminal 20 of the battery 1 through the positive electrode connector 110, the first resistor 211, the first switch 310, the second resistor 212, and the negative electrode connector 120 is formed. For reference, before the control unit 600 controls only the first switch 310 to be turned on, that is, when the apparatus 1000 for calculating characteristics of a battery is in the standby state, the positive electrode parasitic capacitor 14 and the negative electrode parasitic capacitor 24 of the battery 1 are in a state in which they are already charged with voltages.

When a resistance value of the first resistor 211 is R4 and a resistance value of the second resistor 212 is R5, the first ADC 410 detects and outputs a voltage value Vp as expressed in the following Equation 1. In the following Equation 1, the value Vp output from the first ADC 410 is obtained by the control unit 600 through the first signal transfer unit 710. In the following Equation 1, Vb is a voltage of the battery 1.

$$Vp = Vb \times R5/(R4+R5) \quad \text{[Equation 1]}$$

After the step S200, the control unit 600 calculates the voltage Vb of the battery 1 through the value Vp output from the first ADC 410 in the state in which only the first switch 310 is turned on (S300). The above Equation 1 may be expressed as the following Equation 2, and the control unit 600 may calculate the voltage Vb of the battery 1 through the following Equation 2.

$$Vb = Vp \times (R4 \pm R5)/R5 \quad \text{[Equation 2]}$$

In the present invention, the control unit 600 calculates the insulation resistances Risop and Rison of the battery 1 by using the voltage Vb of the battery 1 calculated as in the above Equation 2. As described above, in the conventional manner of measuring the insulation resistances, a separate voltage for measuring the insulation resistances should be manually applied to the battery 1, and accordingly, a user is exposed to a risk of an electric shock due to a high voltage applied to the battery 1 as it is. However, according to the present invention, the voltage of the battery 1 is calculated and the insulation resistances Risop and Rison of the battery 1 are calculated by using the calculated voltage of the battery 1, and thus, the user may escape from the risk of the electric shock due to the high voltage applied to the battery 1.

After the step S300, the control unit 600 controls the first switch 310 to be turned off, and controls only the second switch 320 to be turned on for a preset time (e.g., B seconds) (S400).

After the step S400, the control unit 600 obtains a value Visop output from the second ADC 420 in a state in which only the second switch 320 is turned on (S200).

Figure 5B:
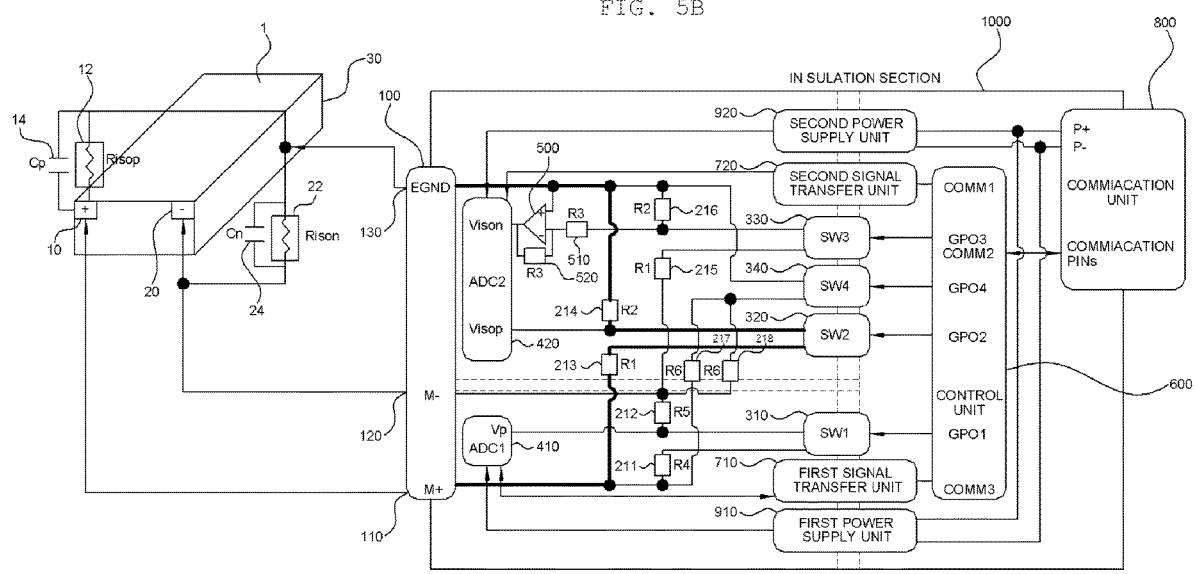
FIG. 5B is a diagram illustrating a current path when only a second switch is controlled to be turned on in the apparatus for calculating characteristics of a battery of FIG. 3.

FIG. 5B is a diagram illustrating a current path when only the second switch is controlled to be turned on in the apparatus for calculating characteristics of a battery of FIG. 3. As illustrated in FIG. 5B, when the control unit 600 controls only the second switch 320 to be turned on, a series combined resistance of the third resistor 213 and the fourth resistor 214 is in parallel with the positive electrode insulation resistor 12 of the battery 1.

At this time, when a resistance value of the third resistor 213 is R1 and a resistance value of the fourth resistor 214 is R2, the second ADC 420 detects and outputs a positive electrode insulation voltage value Visop as expressed in the following Equation 3, and the positive electrode insulation voltage value Visop output from the second ADC 420 is obtained by the control unit 600 through the second signal transfer unit 720.

$$Visop = Vb \times [(R2+R1)\|Risop]/[[(R2+R1)\|Risop]+Rison] \quad \text{[Equation 3]}$$

After the step S500, the control unit 600 controls the second switch 320 to be turned off, and controls only the third switch 330 to be turned on for a preset time (e.g., B seconds) (S600).

After the step S600, the control unit 600 obtains a value Vison output from the second ADC 420 in a state in which only the third switch 330 is turned on (S700).

Figure 5C:
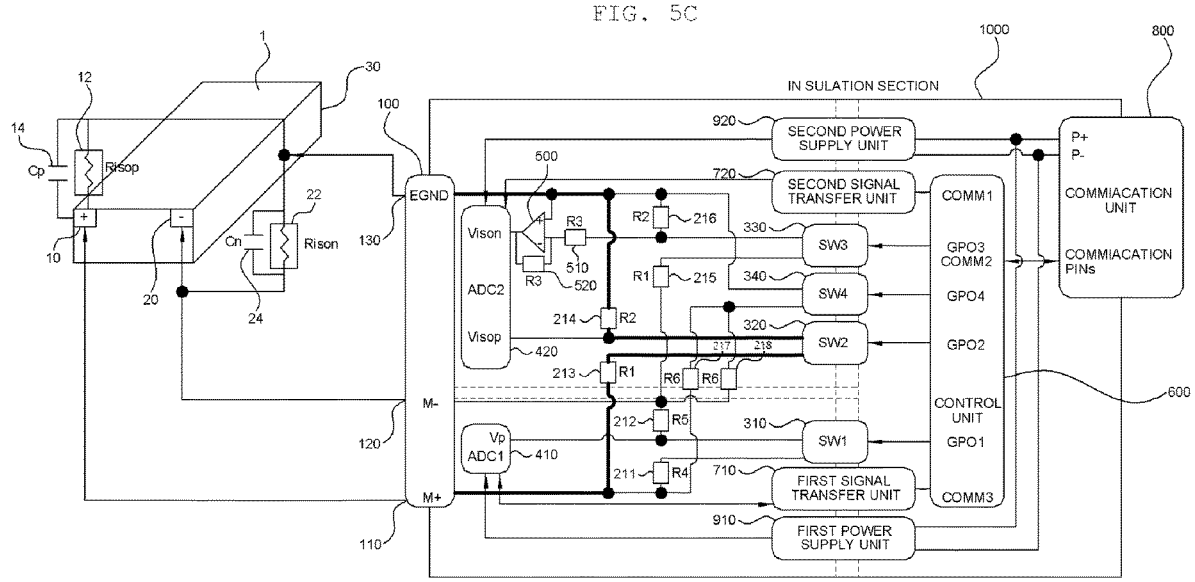
FIG. 5C is a diagram illustrating a current path when only a third switch is controlled to be turned on in the apparatus for calculating characteristics of a battery of FIG. 3.

FIG. 5C is a diagram illustrating a current path when only the third switch is controlled to be turned on in the apparatus for calculating characteristics of a battery of FIG. 3. As illustrated in FIG. 5C, when the control unit 600 controls only the third switch 330 to be turned on, a series combined resistance of the fifth resistor 215 and the sixth resistor 216 is basically in parallel with the negative electrode insulation resistor 22 of the battery 1.

Here, when the apparatus 1000 for calculating characteristics of a battery includes the first amplifier resistor 510, the second amplifier resistor 520, and the operational amplifier 500, and when a resistance value of the fifth resistor 215 is R1, a resistance value of the sixth resistor 216 is R2, and both resistance values of the first amplifier resistor 510 and the second amplifier resistor 520 are R3, the second ADC 420 detects and outputs a negative electrode insulation voltage value Vison as expressed in the following Equation 4. In addition, the negative electrode insulation voltage value Vison output from the second ADC 420 is obtained by the control unit 600 through the second signal transfer unit 720.

$$Vison = Vb \times [(R2\|R3)+R1)\|Rison]/[[(R2\|R3)+R1)\|Rison]+Risop] \quad \text{[Equation 4]}$$

After the step S700, the control unit 600 calculates the insulation resistances Risop and Rison of the battery 1 by using the voltage Vb of the battery 1, the value Visop output from the second ADC 420 in the state in which only the second switch 320 is turned on, and the value Vison output from the second ADC 420 in the state in which the third switch 330 is turned on (S800).

More specifically, the control unit 600 may calculate the positive electrode insulation resistance Risop and the negative electrode insulation resistance Rison of the battery 1 by substituting the voltage Vb of the battery 1 calculated through the above Equation 2 into each of an equation regarding Visop according to the above Equation 3 and an equation regarding Vison according to the above Equation 4 and then combining the above Equations 3 and 4 with each other. The positive electrode insulation resistance Risop of the battery 1 calculated in such a manner is expressed in the following Equation 5, and the negative electrode insulation resistance Rison of the battery 1 calculated in such a manner is expressed in the following Equation 6.

$$Risop = \frac{A/B - A - [(A \times D \times E)/(E - D \times E)]}{1 + [(A \times D)/(E - D \times E)]} \quad \text{[Equation 5]}$$

$$Rison = \frac{E/D - E - [(A \times E \times B)/(A - A \times B)]}{1 + [(E \times B)/(A - A \times B)]} \quad \text{[Equation 6]}$$

In the above Equations 5 and 6, parameters A, B, D, and E are as follows, respectively.

$$A = 1/(1/R2 + 1/R3) + R1$$

$$B = (Vison/Vb) \times [R1 + (R2\|R3)]/(R2\|R3)$$

$$D = (Visop/Vb) \times [(R1+R2)/R2]$$

$$E = R1 + R2$$

Although it has been described above that steps S600 and S700 are performed after steps S400 and S500, the order may be changed so that steps S600 and S700 are first performed and steps S400 and S500 are then performed. That is, the control unit 600 may first control only the third switch 330 to be turned on and then obtain the value Vison output from the second ADC 420 in the state in which only the third switch 330 is turned on, and control only the second switch 320 to be turned on and then obtain the value Vison output from the second ADC 420 in the state in which only the second switch 320 is turned on.

In a conventional method for measuring the insulation resistances of the battery 1 by using the DCR meter, the insulation resistances of the battery 1 might be measured only when any one of positive electrode insulation and negative electrode insulation of the battery 1 is broken. That is, in the conventional method, the insulation resistances of the battery 1 might not be measured when both the positive electrode insulation and the negative electrode insulation of the battery 1 are broken On the other hand, according to the present invention, the insulation resistances of the battery 1 are calculated by using (for example, combining) both of the value Visop output from the second ADC 420 in the state in which only the second switch 320 is turned on and the value Vison output from the second ADC 420 in the state in which only the third switch 330 is turned on, and thus, the positive electrode insulation resistance Risop and the negative electrode insulation resistance Rison of the battery 1 may be simultaneously calculated with high accuracy even when both the positive electrode insulation and the negative electrode insulation of the battery 1 are broken.

Meanwhile, after the control unit 600 calculates the insulation resistances Risop and Rison of the battery 1 in the step S800, the control unit 600 may calculate the positive electrode parasitic capacitance Cp of the battery 1 or calculate the negative electrode parasitic capacitance Cn of the battery 1. A method for calculating the positive electrode parasitic capacitance Cp of the battery 1 will hereinafter be described first, but the negative electrode parasitic capacitance Cn of the battery 1 may also be calculated first.

In order to calculate the positive electrode parasitic capacitance Cp of the battery 1, the control unit 600 first controls only the fourth switch 340 to be turned on (S900).

When only the fourth switch 340 is controlled to be turned on, the control unit 600 may calculate initial voltage values applied to the positive electrode parasitic capacitor 14 and the negative electrode parasitic capacitor 24, respectively.

More specifically, when the control unit 600 controls only the fourth switch 340 to be turned on, the seventh resistor 217 is in parallel with the positive electrode parasitic capacitor 14 and the eighth resistor 218 is in parallel with the negative electrode parasitic capacitor 24.

Accordingly, voltages each applied to the positive electrode parasitic capacitor 14 and the negative electrode parasitic capacitor 24 are distributed according to a resistance value of the seventh resistor 217 and a resistance value of the eighth resistor 218. When the voltage Vb of the battery 1 at a point in time when the control unit 600 controls only the fourth switch 340 to be turned on is 1000 V and both the resistance values of the seventh resistor 217 and the eighth resistor 218 are R6, that is, are the same as each other, the voltages each applied to the positive electrode parasitic capacitor 14 and the negative electrode parasitic capacitor 24 become 500 V. Here, the voltages of 500V correspond to the initial voltage values each applied to the positive electrode parasitic capacitor 14 and the negative electrode parasitic capacitor 24.

That is, when the voltage of the battery 1 at the point in time when the control unit 600 controls only the fourth switch 340 to be turned on is Vb, the initial voltage value applied to the positive electrode parasitic capacitor 14 is Vb/2 when both the resistance value of the seventh resistor 217 and the resistance value of the eighth resistor 218 are R6, that is, are the same as each other. Here, the initial voltage value Vb/2 applied to the positive electrode parasitic capacitor 14 may be used by the control unit 600 to calculate the positive electrode parasitic capacitance Cp of the positive electrode parasitic capacitor 14 according to Equation 11 to be described later.

In addition, when the voltage of the battery 1 at the point in time when the control unit 600 controls only the fourth switch 340 to be turned on is Vb, the initial voltage value applied to the negative electrode parasitic capacitor 24 is Vb/2 when both the resistance value of the seventh resistor 217 and the resistance value of the eighth resistor 218 are R6, that is, are the same as each other. Here, the initial voltage value Vb/2 applied to the negative electrode parasitic capacitor 24 may be used by the control unit 600 to calculate the negative electrode parasitic capacitance Cn of the negative electrode parasitic capacitor 24 according to Equation 16 to be described later.

As described above, according to the present invention, the control unit 600 controls only the fourth switch 340 to be turned on to calculate the initial voltage values each applied to the positive electrode parasitic capacitor 14 and the negative electrode parasitic capacitor 24, such that the positive electrode parasitic capacitance Cp and the negative electrode parasitic capacitance Cn may be calculated more stably and with high accuracy.

After the step S900, the control unit 600 controls the second switch 320 to be turned on for a preset time (i.e., for C seconds) from a to second to a $t_0$+C second in a state in which only the fourth switch 340 is turned on (S1000). Here, to refers to a time when the second switch 320 is controlled to be turned on in the state in which only the fourth switch 340 is turned on.

After the step S1000, the control unit 600 obtains a value Visop output from the second ADC 420 for C seconds in a state in which only the second switch 320 and the fourth switch 340 are turned on (S1100).

FIG. 6A is a diagram illustrating a current path when only the second switch and the fourth switch are controlled to be turned on in the apparatus for calculating characteristics of a battery of FIG. 3. As illustrated in FIG. 6A, when the control unit 600 controls only the second switch 320 and the fourth switch 340 to be turned on, a series combined resistance of the third resistor 213 and the fourth resistor 214 is in parallel with the seventh resistor 217, and is also in parallel with the positive electrode insulation resistor 12 of the battery 1. In addition, the eighth resistor 218 is in parallel with the negative electrode insulation resistor 22 of the battery 1.

At this time, when a resistance value of the third resistor 213 is R1, a resistance value of the fourth resistor 214 is R2, and each of resistance values of the seventh resistor 217 and the eighth resistor 218 is R6, the second ADC 420 detects and outputs a positive electrode insulation voltage value Visop(SP) as expressed in the following Equation 7, and the positive electrode insulation voltage value Visop(SP) output from the second ADC 420 is obtained by the control unit 600 through the second signal transfer unit 720.

$$\text{Visop}(SP)=Vb(SP)\times[\text{Risop}\|R6\|(R1+R2)]/[[\text{Risop}\|R6\|(R1+R2)]+(\text{Rison}\|R6)] \qquad \text{[Equation 7]}$$

In the above Equation 7, the positive electrode insulation voltage value Visop(SP) is a value detected and output by the second ADC 420 after a time enough for the positive electrode parasitic capacitor 14 to be no longer discharged has elapsed (for example, after C seconds have elapsed). In addition, in the Equation 7, Vb(SP) refers to a voltage of the battery 1 after a time enough for the positive electrode parasitic capacitor 14 to be no longer discharged has elapsed (for example, after C seconds have elapsed).

As described above, the control unit 600 obtains the value output from the second ADC 420 for C seconds in the state in which only the second switch 320 and the fourth switch 340 are turned on, and the positive electrode insulation voltage value Visop detected and output by the second ADC 420 for C seconds is a value that changes in real time according to time t. Accordingly, when the above Equation 7 is expressed as the value that changes in real time according to time t, it is expressed by the following Equation 8.

$$\text{Visop}(t) = Vb(t) \times [\text{Risop} \| R6 \| (R1+R2)] / [[\text{Risop} \| R6 \| (R1+R2)] + (\text{Rison} \| R6)] \quad [\text{Equation 8}]$$

In addition, the above Equation 8 may be expressed as the following Equation 9.

$$Vb(t) = [[\text{Risop} \| R6 \| (R1+R2)] / (\text{Rison} \| R6)] \times \text{Visop}(t) / [\text{Risop} \| R6 \| (R1+R2)] \quad [\text{Equation 9}]$$

Meanwhile, a total energy Ep generated by discharge in the positive electrode parasitic capacitor 14 is expressed by the following Equation 10.

$$Ep = \int_{t_0}^{t_0+C} \frac{[Vb(t) - Vb(SP)]^2}{RA} dt = \frac{Cp}{2}\left[\frac{Vb}{2} - Vb(SP)\right]^2 \quad [\text{Equation 10}]$$

In the above Equation 10, RA refers to a total resistance between the positive electrode terminal 10 of the battery 1 and the case 30 of the battery 1 in the state in which only the second switch 320 and the fourth switch 340 are turned on. Referring to FIG. 6A, when the control unit 600 controls only the second switch 320 and the fourth switch 340 to be turned on, the series combined resistance of the third resistor 213 and the fourth resistor 214 is in parallel with the seventh resistor 217 and is also in parallel with the positive electrode insulation resistor 12 of the battery 1, and thus, RA is Risop∥R6∥(R1+R2).

When the above Equation 10 is arranged as an equation regarding the positive electrode parasitic capacitance Cp of the positive electrode parasitic capacitor 14, it may be expressed as the following Equation 11.

$$Cp = \frac{2Ep}{[Vb/2 - Vb(SP)]^2} \quad [\text{Equation 11}]$$

As can be seen from the above Equations 9 to 11, after the step S1100, the control unit 600 may calculate the positive electrode parasitic capacitance Cp of the battery 1 by using the voltage Vb of the battery 1 calculated in the step S300, the insulation resistances Risop and Rison of the battery 1 calculated in the step S800, and a value Visop(t) output from the second ADC 420 in the state in which only the second switch 320 and the fourth switch 340 are turned on (S1200).

Meanwhile, after the control unit 600 calculates the insulation resistances Risop and Rison of the battery 1 in the step S800, the control unit 600 may calculate the negative electrode parasitic capacitance Cn of the battery 1.

In order to calculate the negative electrode parasitic capacitance Cn of the battery 1, the control unit 600 first controls only the fourth switch 340 to be turned on (S900').

As described above, when only the fourth switch 340 is controlled to be turned on, the control unit 600 may calculate initial voltage values applied to the positive electrode parasitic capacitor 14 and the negative electrode parasitic capacitor 24, respectively.

After the step S900', the control unit 600 controls the third switch 330 to be turned on for a preset time (i.e., for C' seconds) from a $t_0'$ second to a $t_0'+C'$ second in a state in which only the fourth switch 340 is turned on (S1000'). Here, $t_0'$ refers to a time when the third switch 330 is controlled to be turned on in the state in which only the fourth switch 340 is turned on.

After the step S1000', the control unit 600 obtains a value Vison output from the second ADC 420 for C' seconds in a state in which only the third switch 330 and the fourth switch 340 are turned on (S1100').

FIG. 6B is a diagram illustrating a current path when only the third switch and the fourth switch are controlled to be turned on in the apparatus for calculating characteristics of a battery of FIG. 3. As illustrated in FIG. 6B, when the control unit 600 controls only the third switch 330 and the fourth switch 340 to be turned on, a series combined resistance of the fifth resistor 215 and the sixth resistor 216 is in parallel with the eighth resistor 218, and is also in parallel with the negative electrode insulation resistor 22 of the battery 1. In addition, the seventh resistor 217 is in parallel with the positive electrode insulation resistor 12 of the battery 1.

At this time, when a resistance value of the fifth resistor 215 is R1, a resistance value of the sixth resistor 216 is R2, and each of resistance values of the seventh resistor 217 and the eighth resistor 218 is R6, the second ADC 420 detects and outputs a negative electrode insulation voltage value Vison(SN) as expressed in the following Equation 12, and the negative electrode insulation voltage value Vison(SN) output from the second ADC 420 is obtained by the control unit 600 through the second signal transfer unit 720.

$$\text{Vison}(SN) = Vb(SN) \times [\text{Rison} \| R6 \| (R1+R2 \| R3)] / [[\text{Rison} \| R6 \| (R1+R2 \| R3)] + (\text{Risop} \| R6)] \quad [\text{Equation 12}]$$

In the above Equation 12, the negative electrode insulation voltage value Vison(SN) is a value detected and output by the second ADC 420 after a time enough for the negative electrode parasitic capacitor 24 to be no longer discharged has elapsed (for example, after C' seconds have elapsed). In addition, in the Equation 12, Vb(SN) refers to a voltage of the battery 1 after a time enough for the negative electrode parasitic capacitor 24 to be no longer discharged has elapsed (for example, after C' seconds have elapsed).

As described above, the control unit 600 obtains the value output from the second ADC 420 for C' seconds in the state in which only the third switch 330 and the fourth switch 340 are turned on, and the negative electrode insulation voltage value Vison detected and output by the second ADC 420 for C' seconds is a value that changes in real time according to time t. Accordingly, when the above Equation 12 is expressed as the value that changes in real time according to time t, it is expressed by the following Equation 13.

$$\text{Vison}(t) = Vb(t) \times [\text{Rison} \| R6 \| (R1+R2 \| R3)] / [[\text{Rison} \| R6 \| (R1+R2 \| R3)] + (\text{Risop} \| R6)] \quad [\text{Equation 13}]$$

In addition, the above Equation 13 may be expressed as the following Equation 14.

$$Vb(t) = [[\text{Rison} \| R6 \| (R1+R2 \| R3)] / (\text{Risop} \| R6)] \times \text{Vison}(t) / [\text{Rison} \| R6 \| (R1+R2 \| R3)] \quad [\text{Equation 14}]$$

Meanwhile, a total energy En generated by discharge in the negative electrode parasitic capacitor 24 is expressed by the following Equation 15.

$$En = \int_{t'_0}^{t'_0+C} \frac{[Vb(t) - Vb(SN)]^2}{RB} dt = \frac{Cn}{2}\left[\frac{Vb}{2} - Vb(SN)\right]^2 \quad \text{[Equation 15]}$$

In the above Equation 15, RB refers to a total resistance between the negative electrode terminal 20 of the battery 1 and the case 30 of the battery 1 in the state in which only the third switch 330 and the fourth switch 340 are turned on. Referring to FIG. 6B, when the control unit 600 controls only the third switch 330 and the fourth switch 340 to be turned on, the series combined resistance of the fifth resistor 215 and the sixth resistor 216 is in parallel with the eighth resistor 218 and is also in parallel with the negative electrode insulation resistor 22 of the battery 1, and thus, RB is Rison∥R6∥(R1+R2∥R3).

When the above Equation 15 is arranged as an equation regarding the negative electrode parasitic capacitance Cn of the negative electrode parasitic capacitor 24, it may be expressed as the following Equation 16.

$$Cn = \frac{2En}{[Vb/2 - Vb(SN)]^2} \quad \text{[Equation 16]}$$

As can be seen from the above Equations 14 to 16, after the step S1100', the control unit 600 may calculate the negative electrode parasitic capacitance Cn of the battery 1 by using the voltage Vb of the battery 1 calculated in the step S300, the insulation resistances Risop and Rison of the battery 1 calculated in the step S800, and a value Vison(t) output from the second ADC 420 in the state in which only the third switch 330 and the fourth switch 340 are turned on (S1200').

According to the present invention, the insulation resistances of the battery are calculated by using (for example, combining) both of the value output from the second ADC in the state in which only the second switch is turned on and the value output from the second ADC in the state in which only the third switch is turned on, and thus, the positive electrode insulation resistance and the negative electrode insulation resistance of the battery may be simultaneously calculated with high accuracy even when both the positive electrode insulation and the negative electrode insulation of the battery are broken.

In the present invention, the positive electrode connector and the negative electrode connector are coupled to the positive electrode terminal and the negative electrode terminal of the battery, respectively, and the ground connector is coupled to the case of the battery. Accordingly, even though the battery is positioned inside the chamber in order to perform the temperature test or the like of the battery, the insulation resistances and the parasitic capacitances of the battery may be calculated without needing to move the battery to the outside of the chamber, and thus, the insulation resistances and the parasitic capacitances of the battery may be conveniently calculated.

In addition, conventionally, the insulation resistances of the battery should be manually measured twice by using the DCR meter, and the parasitic capacitances of the battery should be manually measured twice by using the LCR meter. However, in the present invention, when the positive electrode connector and the negative electrode connector are coupled to the positive electrode terminal and the negative electrode terminal of the battery, respectively, and the ground connector is coupled to the case of the battery, the control unit automatically calculates the insulation resistances and the parasitic capacitances of the battery, and thus, the characteristics of the battery may be conveniently confirmed as compared with the conventional art.

According to the present invention, instead of manually applying a separate voltage for measuring the insulation resistances to the battery, the voltage of the battery is calculated and the insulation resistances of the battery are calculated by using the calculated voltage of the battery, and thus, the user may escape from the risk of the electric shock due to the high voltage applied to the battery.

In addition, in the conventional method of measuring the parasitic capacitances of the battery by using the LCR meter, the LCR meter is affected by the voltage of the battery, such that it is difficult to accurately measure the parasitic capacitances. However, according to the present invention, the parasitic capacitances are calculated in a manner of discharging a voltage already charged in the parasitic capacitors, and may thus be calculated with high accuracy.

Although the present invention has been described with reference to respective embodiments and the drawings, the present invention is not limited to the abovementioned embodiments, and may be variously modified and altered from the above description by those skilled in the art to which the present invention pertains. Therefore, the technical spirit of the present invention should be understood only by the claims, and all of the equivalences and equivalent modifications to the claims will be intended to fall within the scope of the technical spirit of the present invention.

What is claimed is:

1. An apparatus for calculating characteristics of a battery, comprising:
    a positive electrode connector coupled to a positive electrode terminal of the battery;
    a negative electrode connector coupled to a negative electrode terminal of the battery;
    a ground connector coupled to a case of the battery;
    a first resistor having one end coupled to the positive electrode connector;
    a second resistor having one end coupled to the negative electrode connector;
    a first switch having one end coupled to the other end of the first resistor and the other end coupled to the other end of the second resistor;
    a first analog-digital converter (ADC) coupled to the other end of the second resistor;
    a third resistor having one end coupled to the positive electrode connector and one end of the first resistor;
    a fourth resistor having one end coupled to the ground connector;
    a second switch having one end coupled to the other end of the third resistor and the other end coupled to the other end of the fourth resistor;
    a fifth resistor having one end coupled to the negative electrode connector and one end of the second resistor;
    a sixth resistor having one end coupled to the ground connector and one end of the fourth resistor;
    a third switch having one end coupled to the other end of the fifth resistor and the other end coupled to the other end of the sixth resistor;
    a second ADC coupled to the other end of the fourth resistor and the other end of the sixth resistor; and
    a control unit controlling turn-on/off of the first switch, the second switch, and the third switch and calculating insulation resistances of the battery through values each output from the first ADC and the second ADC.

2. The apparatus for calculating characteristics of a battery of claim 1, further comprising:
   a first amplifier resistor having one end coupled to the other end of the sixth resistor;
   a second amplifier resistor having one end coupled to the other end of the first amplifier resistor; and
   an operational amplifier including an inverting input terminal coupled to the other end of the first amplifier resistor and one end of the second amplifier resistor, a non-inverting input terminal coupled to the ground connector, one end of the fourth resistor, and one end of the sixth resistor, and an output terminal coupled to the other end of the second amplifier resistor and the second ADC.

3. The apparatus for calculating characteristics of a battery of claim 1, wherein the control unit
   controls only the first switch to be turned on to obtain a value output from the first ADC in a state in which only the first switch is turned on, and
   calculates a voltage of the battery through the value output from the first ADC in the state in which only the first switch is turned on, and calculates the insulation resistances of the battery by using the voltage of the battery.

4. The apparatus for calculating characteristics of a battery of claim 3, wherein the control unit
   controls only the second switch to be turned on to obtain a value output from the second ADC in a state in which only the second switch is turned on,
   controls only the third switch to be turned on to obtain a value output from the second ADC in a state in which only the third switch is turned on, and
   calculates the insulation resistances of the battery by further using the value output from the second ADC in the state in which only the second switch is turned on and the value output from the second ADC in the state in which only the third switch is turned on.

5. The apparatus for calculating characteristics of a battery of claim 4, further comprising:
   a seventh resistor having one end coupled to the positive electrode connector, one end of the first resistor, and one end of the third resistor;
   an eighth resistor having one end coupled to the negative electrode connector, one end of the second resistor, and one end of the fifth resistor; and
   a fourth switch having one end coupled to the other end of the seventh resistor and the other end of the eighth resistor and the other end coupled to the ground connector, one end of the fourth resistor, and one end of the sixth resistor,
   wherein the control unit additionally controls turn-on/off of the fourth switch, and calculates parasitic capacitances of the battery through the voltage of the battery, the insulation resistances of the battery, and the value output from the second ADC.

6. The apparatus for calculating characteristics of a battery of claim 5, wherein the control unit
   controls only the fourth switch to be turned on and then controls the second switch to be turned on to obtain a value output from the second ADC in a state in which only the second switch and the fourth switch are turned on, and
   calculates a positive electrode parasitic capacitance of the battery by using the value output from the second ADC in the state in which only the second switch and the fourth switch are turned on.

7. The apparatus for calculating characteristics of a battery of claim 5, wherein the control unit
   controls only the fourth switch to be turned on and then controls the third switch to be turned on to obtain a value output from the second ADC in a state in which only the third switch and the fourth switch are turned on, and
   calculates a negative electrode parasitic capacitance of the battery by using the value output from the second ADC in the state in which only the third switch and the fourth switch are turned on.

* * * * *